United States Patent [19]

Idaka et al.

[11] Patent Number: 5,151,602

[45] Date of Patent: Sep. 29, 1992

[54] SEMICONDUCTOR RELAY CIRCUIT USING PHOTOVOLTAIC DIODES

[75] Inventors: Yukio Idaka; Shuichiroh Yamaguchi; Hisakazu Miyajima; Takeshi Matsumoto; Yasunori Miyamoto, all of Kadoma, Japan

[73] Assignee: Matsushita Electric Works, Ltd., Osaka, Japan

[21] Appl. No.: 648,862

[22] Filed: Jan. 31, 1991

[30] Foreign Application Priority Data

Feb. 15, 1990 [JP] Japan ................... 2-34567
Oct. 26, 1990 [JP] Japan ................... 2-289463
Oct. 26, 1990 [JP] Japan ................... 2-289464

[51] Int. Cl.[5] ............... G02B 27/00; H03K 3/42
[52] U.S. Cl. .................... 250/551; 307/311
[58] Field of Search ................. 250/551; 307/311

[56] References Cited

U.S. PATENT DOCUMENTS

| 4,277,098 | 10/1980 | Brown et al. | 307/311 |
| 4,390,790 | 6/1983 | Rodriguez | 250/551 |
| 4,801,822 | 1/1989 | Idaka et al. | 307/311 |
| 4,804,866 | 2/1989 | Akiyama | 307/311 |
| 4,916,323 | 4/1990 | Hayashi et al. | 250/551 |
| 5,013,926 | 5/1991 | Aizawa | 250/551 |
| 5,057,694 | 10/1991 | Idaka et al. | 307/311 |

FOREIGN PATENT DOCUMENTS 1-88528 12/1989 Japan .

Primary Examiner—David C. Nelms
Assistant Examiner—Michael Messinger
Attorney, Agent, or Firm—Burns, Doane, Swecker & Mathis

[57] ABSTRACT

A semiconductor relay circuit includes a MOS FET receiving a photovoltaic output generated across a photovoltaic diode array. The photovoltaic diode array is responsive to a light signal from a light-emitting element. A cross gate and source electrodes of a MOS FET is connected a control circuit which is at a high impedance state during the generation of the photovoltaic output but to be at a low impedance state upon disappearance of the output. Additionally, resistors are inserted in series respectively in each of current, one path flowing from the photovoltaic diode array across the gate and source electrodes of the MOS FET and the other path flowing a discharge current from a capacity across the gate and source electrodes of the MOS FET to the control circuit, whereby the setting of rise and fall of circuit output signals can be made easier.

5 Claims, 4 Drawing Sheets

SEMICONDUCTOR RELAY CIRCUIT USING PHOTOVOLTAIC DIODES

BACKGROUND OF THE INVENTION

This invention relates to a semiconductor relay circuits and, more particularly, to a semiconductor relay circuit in which a light-emitting diode converts an input signal to a light signal, a photovoltaic diode array optically coupled to the light-emitting diode converts the light signal to an electrical signal which is used for driving a metal-oxide-semiconductor field effect transistor (hereinafter, referred to simply as "MOS FET") as an output means to obtain a contact signal as an output.

DISCLOSURE OF RELATED ART

There has been proposed in U.S. Pat. No. 4,227,098 to Dale M. Brown et al. a semiconductor relay circuit in which a photovoltaic diode array is optically coupled to a light-emitting diode and the diode array is connected in parallel with a resistor for providing to the array a resistive impedance and in series with gate and substrate electrodes of the MOS FET. When a current flows across input terminals of the light-emitting diode in this relay circuit, a photovoltaic output is generated across both end terminals of the diode array and is applied across the gate and source electrodes of the MOS FET. Consequently thereto, the impedance of the MOS FET between output terminals connected to current passage electrodes of the MOS FET is remarkably changed to a different value. In the case of MOS FET of enhancement type, the state across the output terminals is shifted from OFF state to ON state, so that the relay circuit can perform the same function as electromechanical relays, without having any mechanical moving parts.

In this U.S. patent, however, there has been such a problem that it is necessary to make the value of the resistor large in order to reduce the required minimum input current, i.e., the operating current for turning this semiconductor relay circuit ON. However, it is necessary to make the resistance value small in order to shorten the time taken from interruption of the input current to turning OFF of the state across the output terminals. The result is it has been difficult to concurrently achieve these two functions. Another problem of this known relay circuit is that, when the resistor connected in parallel to the photovoltaic diode array is of too large a value, a large voltage variation occurring across the output terminals in the absence of the input current to the input terminals will cause a mirror current by a parasitic capacitance between the drain and gate of the MOS FET, whereby the gate voltage of the MOS FET is increased so that an instantaneous mistriggering (turning on) will readily occur.

Further, U.S. Pat. No. 4,390,790 to Edward T. Rodriguez discloses a solid state relay circuit in which a photovoltaic diode array optically coupled to a light-emitting diode is connected in series with a MOS FET which has a normally-ON junction FET connected between the gate and source electrodes of the MOS FET and an additional photovoltaic diode array is connected between the gate and source electrodes of the junction FET through a resistor. According to Rodriguez, the instantaneous mistriggering of the MOS FET can be prevented by the provision of the additional diode array which can drive the normally-ON junction FET. However, the necessity of the combined circuit arrangement of the junction FET with the additional diode array renders a high speed relay operation to be hardly realizable.

U.S. Pat. No. 4,804,866 to Sigeo Akiyama, further, there discloses a solid state relay circuit in which a normally-ON driving transistor is connected to a MOS FET while this driving transistor is connected at control electrode to a connection point between a photovoltaic diode array and an impedance element so as to be biased by a voltage generated across the impedance element during generation of the photovoltaic output across the photovoltaic diode array to have a high impedance state. According to this U.S. patent, it is possible to restrain such erroneous operation as instantaneous conduction due to any instantaneously varied voltage applied to the relay output terminals in the absence of the input current. However, this U.S. patent has problem in that a rise of an output signal responsive to a rise in an input signal as well as a fall of the output signal responsive to a fall in the input signal are both abrupt in their gradient. This means that, in an event where a capacitive or inductive load is connected to the semiconductor relay circuit, there may arise a risk that an excessive current or voltage is generated upon switching operation, which may cause an electric noise to be generated, resulting in malfunction or the like of associated circuit.

In the above connection, Hideaki Siratori discloses in Japanese Utility Model Laid-Open Publication No. 1-88528 another semiconductor relay circuit in which two resistors are connected mutually in parallel and to an end of a photovoltaic diode array, a diode is connected in parallel to one of these two resistors, and a MOS FET is connected at its gate electrode to the parallel circuit of the resistor and diode. According to this relay circuit, it may be possible to determine by the other of the two resistors a response time $T_{OFF}$ from the fall of the input signal to the fall of the output signal and to set the highest speed of a response time $T_{ON}$ from the rise of the input signal to the rise of the output signal, upon which the foregoing one of the two resistors is contributive only to the setting of lower speeds than the highest speed of the response time $T_{ON}$. The gradient of the rise and fall of the output signal may be made relatively gradual according to this relay circuit. However, this relay circuit has a problem in that an adjustment is made difficult when the light emitting other resistor has a resistance value lower than a predetermined value particularly upon the setting of the response time $T_{ON}$ and $T_{OFF}$ so that a resistor of a relatively large resistance value will be required to be used and the operation of this relay circuit will be unnecessarily slow. Further, while the setting of the response time $T_{OFF}$ upon non-conduction can be attained only with the other of the two resistors employed, the setting of the response time $T_{ON}$ upon conduction requires that both of the two resistors are required to be set in the resistance value, so as to cause a problem to arise in that the setting becomes complicated.

SUMMARY OF THE INVENTION

A primary object of the present invention is, therefore, to provide a semiconductor relay circuit which allows the rising and falling gradient of the output signal to be gradual, the setting of the response time $T_{ON}$ and $T_{OFF}$ upon the conduction and non-conduction to be properly adjustable even if the resistors of relatively lower value are employed, and, if required, the setting of the response time $T_{ON}$ and $T_{OFF}$ to be attainable by adjustment of the value of one of the resistors independently of the other.

According to the present invention, this object can be realized by a semiconductor relay circuit in which a photovoltaic diode array is optically coupled to a light-emitting element to receive a light signal generated by the light-emitting element upon presence of an input current thereto and to generate a photovoltaic output, an output MOS FET is connected to the photovoltaic diode array to vary from a first impedance state to a second impedance state upon application of the photovoltaic output across gate and source electrodes of the MOS FET, and a control means, which is in a high impedance state upon generation of the photovoltaic output but in a low impedance state upon disappearance of the photovoltaic output, is connected across the gate and source electrodes of the MOS FET, further including resistors inserted in series with respect to a path upon which a charge current flows from the photovoltaic diode array across the gate and source electrodes of the MOS FET and a path upon which flows a discharge current from a capacity across the gate and source electrodes of the MOS FET to the control means.

Other objects and advantages of the present invention shall be made clear in following description of the invention detailed with reference to preferred embodiments shown in accompanying drawings.

While the present invention shall now be explained with reference to the embodiments shown in the accompanying drawings, it will be appreciated that its intention is not to limit the invention to only the embodiments shown but rather to include all alterations, modifications and equivalent arrangements possible within the scope of appended claims.

DETAILED DESCRIPTION OF THE PREFERRED EMBODIMENTS

Figure 1:
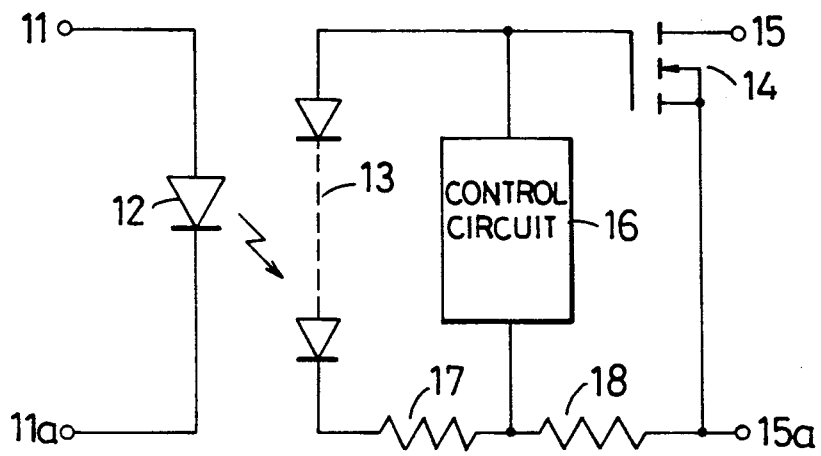
FIG. 1 is a circuit diagram of the semiconductor relay circuit in an embodiment according to the present invention.

Referring to FIG. 1, the semiconductor relay circuit according to the present invention includes a pair of input terminals 11 and 11a receiving an input current signal, of a light-emitting element 12 such as a light-emitting diode, preferably, which is connected between the input terminals 11 and 11a for generating a light signal in response to the input current signal. A diode array 13 is optically coupled to the light-emitting element 12 for generating a photovoltaic output in response to the light signal from the light-emitting element 12. To this diode array 13, a MOS FET 14 is connected in series, and this MOS FET 14 functions to vary from a first impedance state to a second impedance state upon application of the photovoltaic output across gate and source electrodes from the diode array 13. A pair of output terminal 15 and 15a are connected to the MOS FET 14. Across the gate and source electrodes of the MOS FET 14, a control circuit 16 is connected, along with a series circuit of first and second resistors 17 and 18 connected between the diode array 13 and the source electrode of the MOS FET 14 while the control circuit 16 is connected at its one end to a connection point between the first and second resistors 17 and 18.

Figure 2:
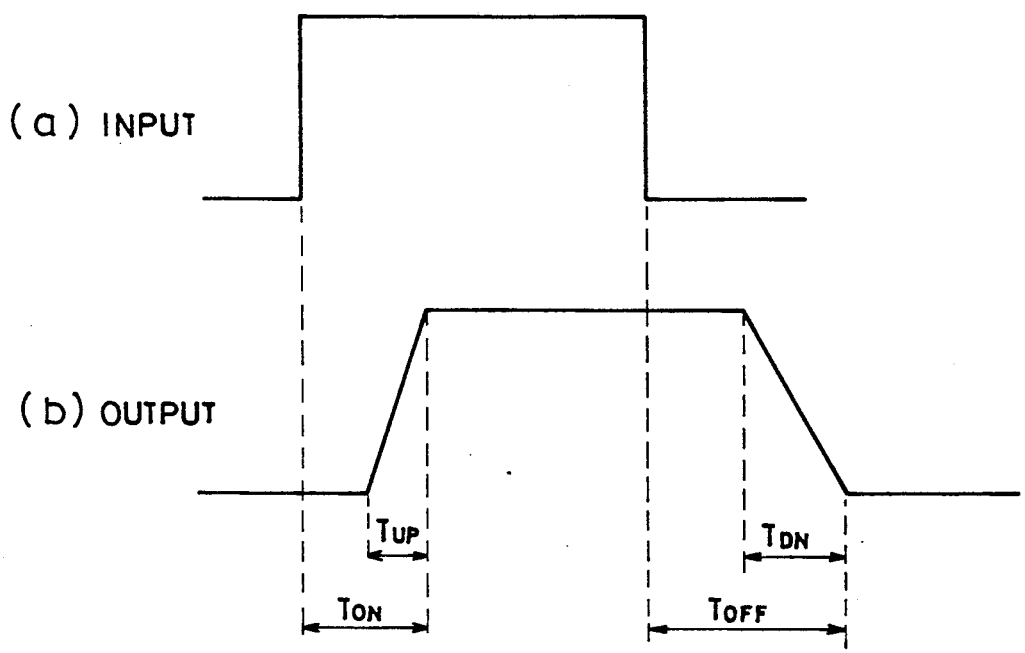
FIGS. 2(a) and 2(b) are operational waveform diagrams in the circuit of FIG. 1.
Figure 3:
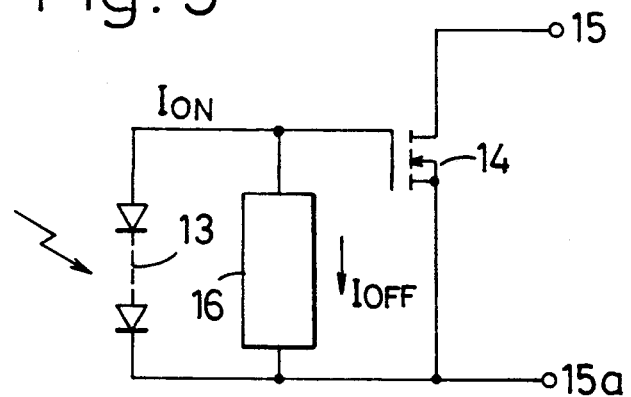
FIG. 3 is a circuit diagram for explaining the operation of the circuit of FIG. 1.

In the above semiconductor relay circuit, an application of an input signal across the input terminals 11 and 11a causes a light signal to be generated from the light-emitting element 12. The photovoltaic diode array 13, which has received this light signal, generates the photovoltaic output across the both ends of the array, upon which the control circuit 16 is in a high impedance state. When the control circuit 16 is in a high impedance state, a capacity across the gate and source electrodes will be charged through the first and second resistors 17 and 18 with the photovoltaic output from the diode array 13, and a voltage across the gate and source electrodes of the MOS FET 14 rises. In this case, the number of the diodes series connected in the photovoltaic diode array 13 is set for generating a higher photovoltaic output than a threshold voltage of the MOS FET 14, so that the MOS FET 14 will conduct across drain and source electrodes and a conduction is thereby attained across the output terminals 15 and 15a. When a current $I_{ON}$ is caused to flow during the conduction as shown in FIG. 3, the voltage across the gate and source electrodes of the MOS FET 14 rises at a rate in accordance with a capacity across the gate and source electrodes and a time constant of the first and second resistors 17 and 18. Thus the response time $T_{ON}$ from a rise of the input signal shown in FIG. 2(a) to a rise of the output signal is relatively prolonged as shown in FIG. 2(b) so that a rising time $T_{UP}$ in the output signal will be of a gradual gradient. Accordingly, it is made possible, even in a case where a capacitor is connected in parallel between the output terminals 15 and 15a, to prevent its charge from being rapidly discharged, and any electric noise generation can be restricted. Here, a balance time of the response time $T_{ON}$ upon the conduction from which the rising time $T_{UP}$ is deducted is to be a required time for the voltage across the gate and source electrodes of the MOS FET 14 to rise from zero level to a threshold value. The rising time $T_{UP}$ subsequent thereto is to be a required time for the voltage across the gate and source electrodes of the MOS FET 14 to further rise from the threshold value to a saturated level.

As the input signal across the input terminals 11 and 11a is interrupted, the light signal from the light-emitting element 12 ceases, which stops the generation of the photovoltaic output of the photovoltaic diode array 13. In this event, the control circuit 16 is to be varied to a low impedance state, so that an accumulated charge at the capacity across the gate and source electrodes of the MOS FET 14 will be discharged through the control circuit 16 and the second resistor 18 of the series connected resistors, as shown by a current $I_{OFF}$ in FIG. 2. Thus, the voltage across the gate and source electrodes of the MOS FET 14 is lowered to be below the threshold value, and the MOS FET 14 attains an interrupted state across the gate and source electrodes. Here, the voltage across the gate and source electrodes of the MOS FET 14 is decreased at a rate in accordance with the capacity across the gate and source electrodes and the time constant of the second resistor 18 so that, as shown in FIG. 2, the response time $T_{OFF}$ upon the non-conduction will be prolonged, a falling time $T_{DN}$ in which the output signal falls from 100% to 10% is thereby prolonged, and the falling gradient of the output signal is made gradual. Consequently, it is possible to prevent the current from being abruptly interrupted even in an event where an inductance component is connected in series between the output terminals 15 and 15a, and thus restricts the generation of the electric noise. Here, a balance time of the response time $T_{OFF}$ upon the non-conduction from which the falling time $T_{DN}$ is deducted is to be a required time for the voltage across the gate and source electrodes of the MOS FET 14 to fall from the highest level to a saturated level, and the falling time $T_{DN}$ subsequent thereto is to be a required time for the voltage across the gate and source electrodes of the MOS FET 14 to further fall from the saturated level to a threshold value.

As will be clear from the above, in the semiconductor relay circuit of FIG. 1, the path for flowing current $I_{ON}$ from the photovoltaic diode array 13 to the gate and source electrodes of the MOS FET 14 and the further path for flowing the discharge current from the capacity across the gate and source electrodes of the MOS FET 14 to the control circuit 16 respectively include each of the first and second resistors 17 and 18 so that, in particular, the response time $T_{ON}$ upon the conduction of the MOS FET 14 will be adjusted by these first and second resistors 17 and 18 series connected while the response time $T_{OFF}$ upon the non-conduction will be adjusted by the second resistor 18. It will be readily appreciated that the value of these resistors 17 and 18 may be made relatively extremely low.

Figure 4:
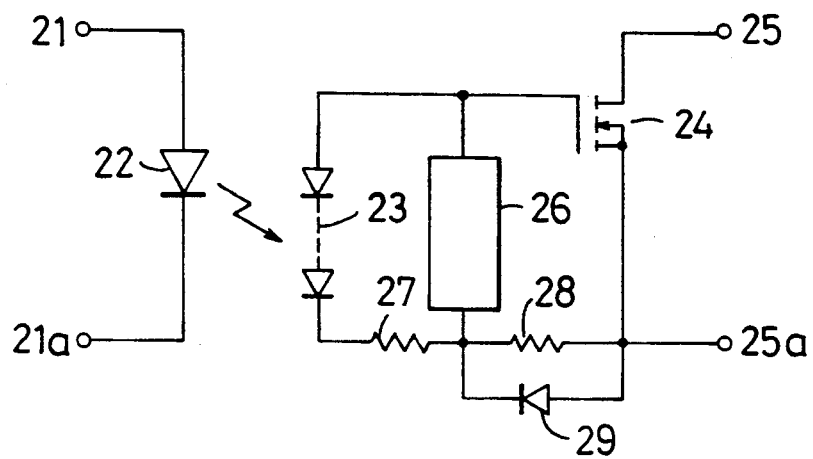
FIG. 4 is a circuit diagram showing the semiconductor relay circuit in another embodiment according to the present invention.

According to another feature of the present invention, further, there is provided an arrangement which allows the both response time $T_{ON}$ and $T_{OFF}$ upon the conduction and non-conduction to be settable respectively independently with an individual one of the resistors. In FIG. 4, there is shown an embodiment of this feature, in which a rectifying element 29 is connected in parallel with the second resistor 28 among the series connected first and second resistors 27 and 28 which are contributive to the setting of the both response time $T_{ON}$ and $T_{OFF}$ upon the conduction and non-conduction, so as to be in normal direction with respect to the charge current upon the conduction but in reverse direction with respect to the discharge current upon the non-conduction. In this case, the charge current upon the conduction is made to flow through the rectifying element 29 and through the first resistor 27 while the discharge current upon the non-conduction is caused to flow through the second resistor 28, accordingly the response time $T_{ON}$ upon the conduction is set by the first resistor 27 while the response time $T_{OFF}$ upon the non-conduction is set by the second resistor 28, and thus the both response time can be set respectively independently by one of the first and second resistors 27 and 28.

Figure 5:
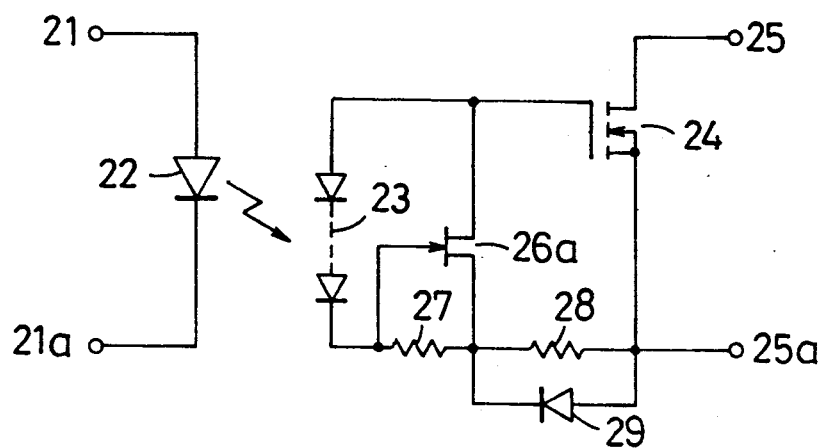
FIG. 5 is a circuit diagram showing a practical working aspect of the circuit in FIG. 4.

For the control circuit 26 in the semiconductor relay circuit of FIG. 4, further, it is possible to employ a controlling MOS FET of a depletion type as shown in FIG. 5, in which event the controlling MOS FET 26a is connected at its drain electrode to the gate electrode of the MOS FET 24, the first resistor 27 is inserted between gate and source electrodes of the controlling MOS FET 26a, and the parallel circuit of the second resistor 28 and rectifying element 29 is inserted between the source electrode of the MOS FET 24 and the source electrode of the controlling MOS FET 26a. It will be appreciated that, in the arrangement, the controlling MOS FET 26a is biased to be in a high impedance state so long as the photovoltaic output is generated at the photovoltaic diode array 23 but to be in a low impedance state when no photovoltaic output is generated.

In the arrangements shown in FIGS. 4 and 5, any other constituents than those described in the above are the same as corresponding ones in the embodiment of FIG. 1, including their function, and the same constituents as those in the embodiment of FIG. 1 are denoted by the same reference numerals but added by 10.

Figure 6:
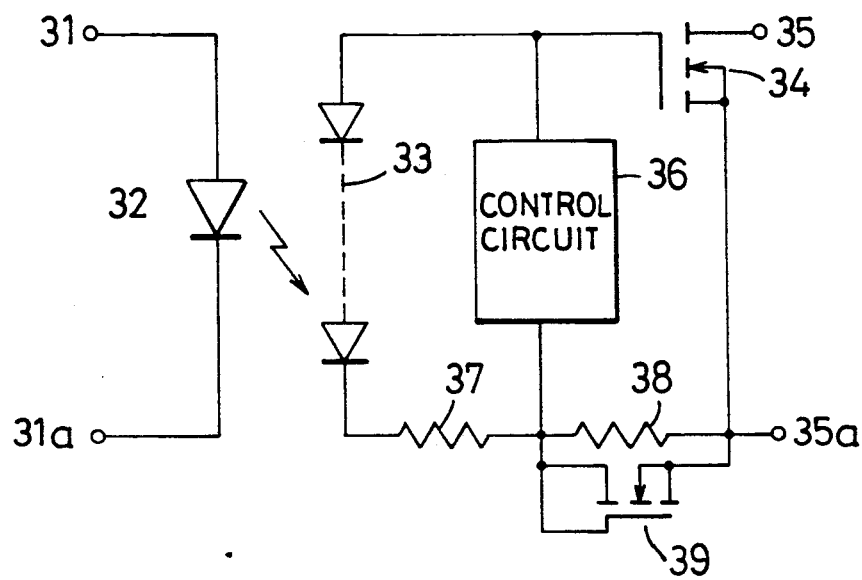
FIG. 6 is a circuit diagram showing the semiconductor relay circuit in a further embodiment according to the present invention.

According to a further feature of the present invention, there is taken a measure for improving the restricting function with respect to the electric noise without prolonging more than required the operation time upon the conduction and non-conduction, but prolonging the fall of the output signal at the response time $T_{OFF}$. In FIG. 6, there is shown a circuit arrangement embodying this feature, in which a voltage responsive element 39 is connected in parallel with the second resistor 38 in the series connected first and second resistors 37 and 38 which are contributive to the setting of the response time $T_{ON}$ and $T_{OFF}$ upon the conduction and non-conduction. For this voltage responsive element 39, preferably, an NMOS FET of enhancement mode having short-circuited drain and gate electrodes is employed. This NMOS FET is to be in the low impedance state until the voltage across the gate and source electrodes of the MOS FET 34 falls to a predetermined voltage level slightly higher than the threshold voltage of the MOS FET 34, but is to be in the high impedance state once the voltage across the gate and source electrodes of the MOS FET 34 falls below the predetermined voltage. Accordingly, the charge current upon the conduction flows through the series connected first and second resistors 37 and 38 so as to set the response time $T_{ON}$, while the discharge current upon the non-conduction is made to flow through the control circuit 36 as well as the voltage responsive element 39 which is in the low impedance state at initial stage of the non-conduction, until the predetermined voltage level slightly higher that the threshold voltage of the MOS FET 34, and through the second resistor 36 when the voltage falls below the predetermined level and the voltage responsive element 39 shifts to the high impedance state. The response time $T_{OFF}$ upon the non-conduction is thereby caused to be subjected stepwise to the current limitation of the voltage responsive element 39 and resistor 38, the discharge rate is made gradual within the predetermined response time, and thus the falling time $T_{DN}$ can be prolonged to a desired extent.

For the foregoing voltage responsive element, it may be possible to employ a Zener diode, other than the NMOS FET. For the control circuit in the semiconductor relay circuit of FIG. 6, further, it will be desirable to use such controlling MOS FET 36a as shown in FIG. 7, which is substantially of the same function as the controlling MOS FET in FIG. 5.

Figure 7:
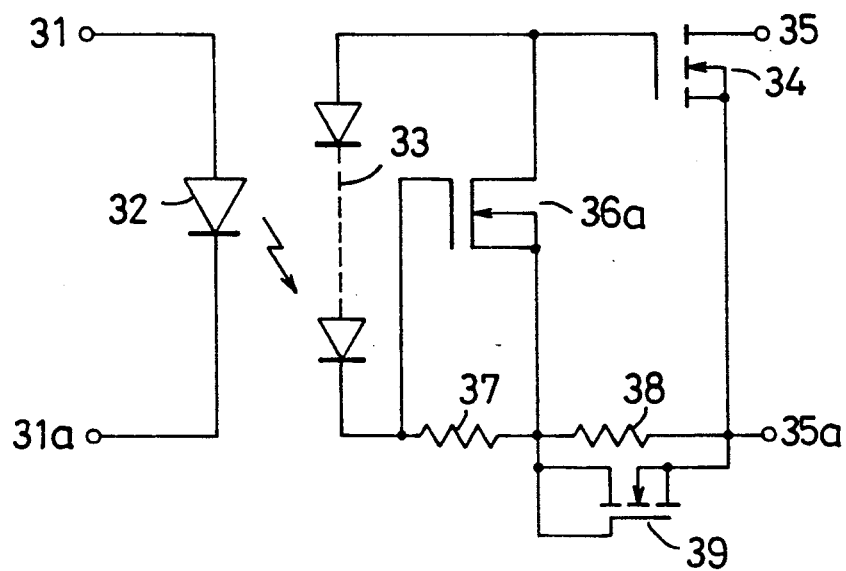
FIG. 7 is a circuit diagram of a practical working aspect of the circuit in FIG. 6.

In the arrangements of FIGS. 6 and 7, any other constituents than those described in the above are the same as those in the embodiment of FIG. 1, including their function, and the same constituents as those in the embodiment of FIG. 1 are denoted by the same reference numerals but added by 20.

In manufacturing the foregoing semiconductor relay circuit in a practical working aspect of, for example, FIG. 5, in addition, a semiconductor substrate 40 is provided in one side surface with a P-type semiconductor layer 42 formed through an insulating film 41 comprising a silicon oxide, and an N-type semiconductor layer 43 is formed in top surface of the layer 42. In this case, the N-type semiconductor layer 43 is formed by a diffusion in the form of a narrow zigzag strip, and aluminum wirings 44 and 45 are connected to both ends of the zigzag strip. In this case, one of these wirings, i.e., the wiring 44 is connected to the foregoing first resistor 27 in the circuit of FIG. 5 while the other wiring 45 is connected to the output terminal 25a of the MOS FET 24 and to the P-type semiconductor layer 42. Consequent thereto, the PN junction between the P-type layer 42 and the N-type layer 43 is reversely biased when the potential at the aluminum wiring 44 is higher than that of the other wiring 45, whereas the PN junction is normally biased when the potential of the wiring 44 is lower than the other wiring 45, that is, the rectifying element 29 is thereby formed. Further, when the PN junction is reversely biased as in the above, a current is caused to flow from the wiring 44 through the N-type layer 43 forming a diffusion resistor to the other wiring 45, so that the second resistor is thereby formed. The value of this resistor 28 is determined by impurity concentration, length and width of the N-type semiconductor layer 43.

Figure 8:
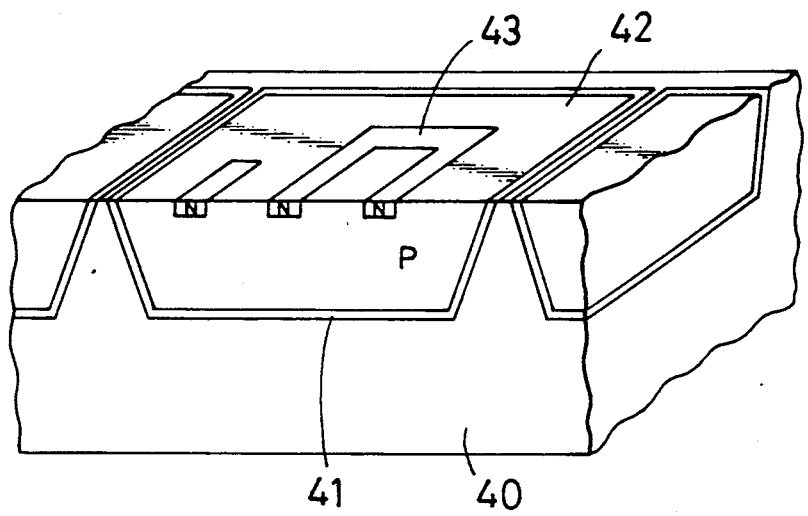
FIG. 8 is a fragmentary perspective view of an integrated circuit employed in the semiconductor relay circuit according to the present invention, shown as sectioned along line VIII—VIII in FIG. 9.
Figure 9:
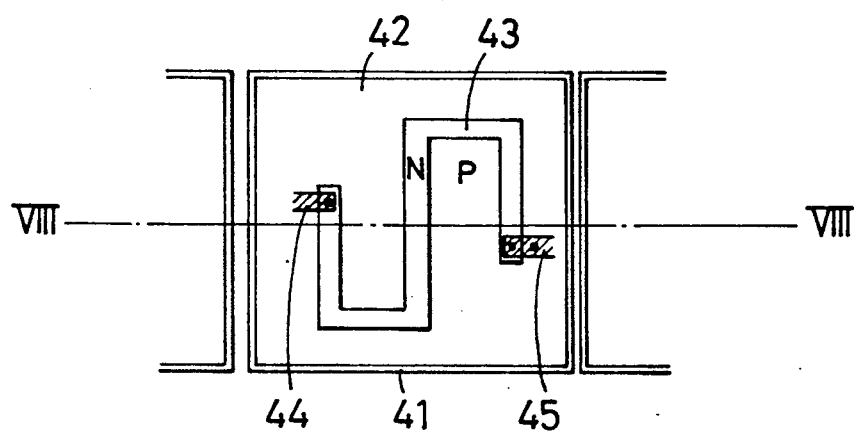
FIG. 9 is a top plan view of the integrated circuit shown in FIG. 8.

With such integrated circuit as shown in FIGS. 8 and 9 utilized, the use of the rectifying element 29 does not result in any increase in its space factor and is rather effective to render the chip area relatively small.

What is claimed is:

1. A semiconductor relay circuit comprising:
    a light-emitting element connected to input terminals of said circuit for generating a light signal upon presence of an input current at said input terminals,
    a photovoltaic diode array optically coupled to said light-emitting element for generating a photovoltaic output responsive to said light signal from the light-emitting element,
    an output MOS FET connected to said photovoltaic diode array and to output terminals of the circuit to vary from a first impedance state to a second impedance state upon application of said photovoltaic output across gate and source electrodes of said MOS FET,
    a control means connected across said gate and source electrodes of said MOS FET to be in a high impedance state upon generation of said photovoltaic output and to be in a low impedance state upon disappearance of said photovoltaic output, and
    resistors inserted in series with respect to a path of a charge current flowing from said photovoltaic diode array across the gate and source electrodes of said MOS FET and in a path of a discharge current flowing from a capacity across said gate and source electrodes of said MOS FET,
    wherein said resistors comprise a first resistor inserted in said path of said charge current and a second resistor inserted in said path of said discharge current.

2. A circuit according to claim 1, wherein a rectifying element is connected in parallel with said second resistor to permit the flow of said charge current and to not permit the flow of said discharge current.

3. A circuit according to claim 2, wherein said rectifying element comprises a PN junction between a first semiconductor layer of one conduction type on a semiconductor substrate and a second semiconductor layer of the other conduction type formed on said first semiconductor layer, said second semiconductor layer being connected at an end to said first semiconductor layer, and said second resistor comprises said second semiconductor layer in parallel to said rectifying element upon reverse biasing of the rectifying element.

4. A circuit according to claim 1, wherein a voltage responsive element is connected in parallel with said second resistor and to be in a low impedance state with respect to said discharge current with a voltage above a predetermined level.

5. A circuit according to claim 4, wherein said voltage responsive element comprises an NMOS FET of an enhancement mode and having short-circuited drain and gate electrodes.

* * * * *